(12) United States Patent  (10) Patent No.: US 6,403,463 B1
Suyama  (45) Date of Patent: Jun. 11, 2002

(54) METHOD FOR FABRICATING A MULTICHIP MODULE TO IMPROVE SIGNAL TRANSMISSION

(75) Inventor: Takayuki Suyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/440,049

(22) Filed: Nov. 15, 1999

(30) Foreign Application Priority Data

Nov. 16, 1998 (JP) ............................................ 10-324882

(51) Int. Cl.⁷ .......................................... H01L 21/4763
(52) U.S. Cl. ........................ 438/622; 438/109; 438/125
(58) Field of Search ................................ 257/700, 701, 257/758, 748, 750, 759, 678, 723, 724, 762, 784; 361/777, 795; 438/106, 125, 107, 619, 622, 109, 110, FOR 368

(56) References Cited

U.S. PATENT DOCUMENTS

| | | | |
|---|---|---|---|
| 5,336,928 A | * | 8/1994 | Neugebauer et al. ....... 257/758 |
| 5,359,496 A | * | 10/1994 | Kornrumpf et al. ........ 361/795 |
| 5,422,513 A | * | 6/1995 | Marcinkiewicz et al. ... 257/668 |
| 5,548,099 A | * | 8/1996 | Cole, Jr. et al. ........ 219/121.69 |
| 5,559,363 A | * | 9/1996 | Immorlica, Jr. ............. 257/664 |
| 5,757,072 A | * | 5/1998 | Gorowitz et al. ........... 257/700 |
| 5,874,770 A | * | 2/1999 | Saia et al. ................... 257/536 |
| 6,154,366 A | * | 11/2000 | Ma et al. ..................... 361/704 |

FOREIGN PATENT DOCUMENTS

| | | |
|---|---|---|
| JP | H4-72656 | 3/1992 |
| JP | H10-229161 | 8/1998 |

* cited by examiner

*Primary Examiner*—Olik Chaudhuri
*Assistant Examiner*—Alonzo Chambliss
(74) *Attorney, Agent, or Firm*—Sughrue Mion, PLLC

(57) ABSTRACT

A multichip module of the present invention includes a substrate having an upper surface, a hole provided on the upper surface of the substrate and a chip provided in the hole. The upper surface of the chip and the upper surface of the substrate forms an even, or substantially even, surface. A first insulating layer is formed on the upper surface of the chip and the upper surface of the substrate and a first wiring layer is formed on the first dielectric layer. A method for manufacturing a multichip module, which includes a substrate having a cavity provided thereon, and a chip, includes providing the chip in the cavity so that the upper surface of the chip and the upper surface of the substrate becomes even, or substantially even. The method also includes forming a first insulating layer on the upper surface of the chip and the upper surface of the substrate, and forming a first wiring layer on the first insulating layer.

2 Claims, 5 Drawing Sheets

2a : ELECTRODE TERMINAL
2b : REFERENCE POTENTIAL TERMINAL
2c : POWER SUPPLY TERMINAL
51,52,53,54 AND 55 : INSULATING LAYER
56,57,58 AND 59 : WIRING LAYER

2a : ELECTRODE TERMINAL
2b : REFERENCE POTENTIAL TERMINAL
2c : POWER SUPPLY TERMINAL

56a : WIRING
56b : WIRING ELECTRODE

56a : WIRING
56b : WIRING ELECTRODE
57a : WIRING
57b : WIRING ELECTRODE
58a : GROUND-POTENTIAL WIRING
58b : WIRING ELECTRODE
59a : POWER-SUPPLY WIRING

METHOD FOR FABRICATING A MULTICHIP MODULE TO IMPROVE SIGNAL TRANSMISSION

BACKGROUND OF THE INVENTION

The present invention relates to a multichip module and manufacturing method, and particularly to a multichip module and manufacturing method which transmit a signal at a high speed and prevents noises from being generated.

As the integration density of a large-scale integrated circuit (LSI) is improved and the signal transfer speed of the LSI is increased, it is necessary for a multichip module to increase the signal transfer speed by improving the wiring density.

Increased wiring density can be achieved by making wires finer. In a conventional multichip module, however, it is difficult to making wires finer because step and stage disconnection occur on the surface toward upper layers of multiple metallic layers. In addition, as wires are made finer, the wiring resistance increases. This increases attenuation of signal amplitude, thus, high-speed signal transfer becomes difficult. Thus, it is difficult to transfer a signal at a high speed solely by improving wiring density.

Moreover, a wire or a solder ball is used as a conventional way of connecting wiring to an LSI chip. However, because the impedance between the wire or solder ball and the wiring is not equal, signal waveform deteriorates.

SUMMARY OF THE INVENTION

An object of the invention is to provide a multichip module and manufacturing method which transfer a signal at a high speed without deterioration.

According to one aspect of the present invention, a multichip module is provided which includes: a substrate having an upper surface; a hole provided on the upper surface of the substrate; a chip provided in the hole, wherein the upper surface of the chip and the upper surface of the substrate form an even, or substantially even, surface; a first insulating layer formed on the upper surface of the chip and the upper surface of the substrate; and a first wiring layer formed on the first dielectric layer.

According to another aspect of the present invention, a multichip module is provided which includes: a substrate having an upper surface; a first hole and a second hole provided on the substrate; a first chip provided in the first hole, wherein an upper surface of the first chip and the upper surface of the substrate form an even, or substantially even, surface; a second chip provided in the second hole, wherein an upper surface of the second chip and the upper surface of the substrate form an even, or substantially even, surface; a first dielectric layer formed on the upper surfaces of the substrate, the first chip and the second chip; and a first wiring layer formed over the first dielectric layer.

According to another aspect of the present invention, a method for manufacturing a multichip module, which includes a substrate having a cavity provided thereon, and a chip, is provided which includes: providing the chip in the cavity so that the upper surface of the chip and the upper surface of the substrate become even, or substantially even; forming a first insulating layer on the upper surface of the chip and the upper surface of the substrate; and forming a first wiring layer on the first insulating layer.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

A first embodiment of the present invention will be described in detail below.

Figure 1:
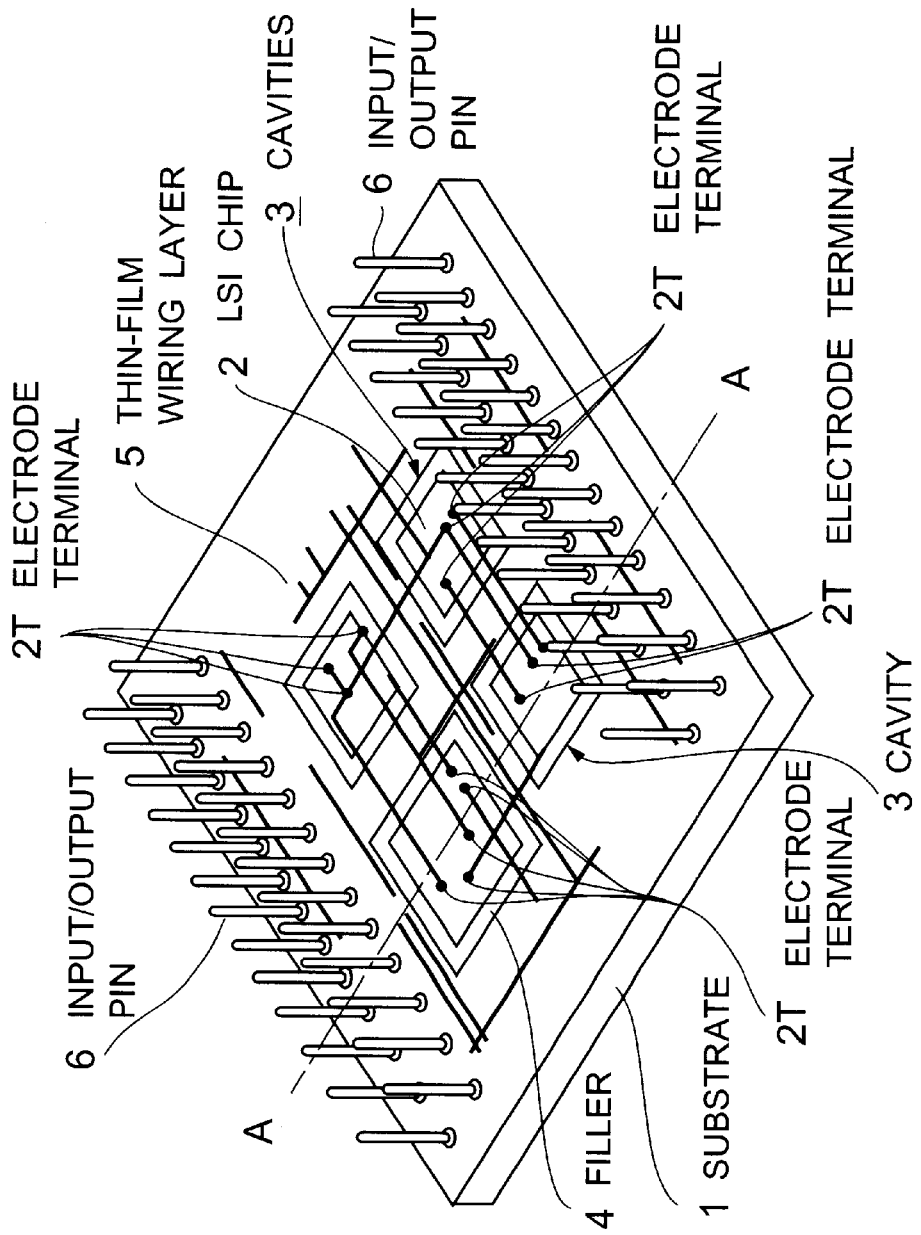
FIG. 1 is a perspective view of the present invention.
Figure 2:
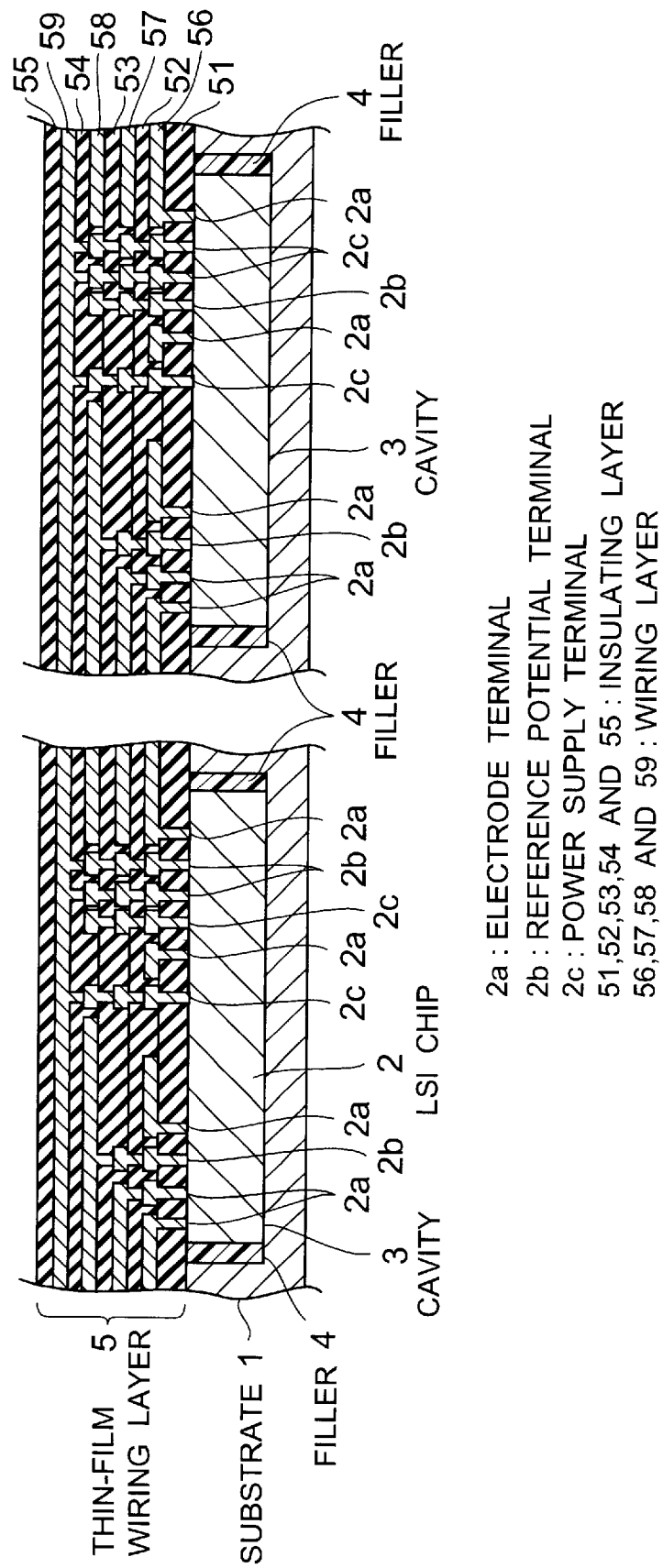
FIG. 2 is a sectional view of the present invention taken along the line A—A of FIG. 1.

Referring to FIGS. 1 and 2, a multichip module includes a substrate 1, LSI chips 2 and input/output pins 6. The material of substrate 1 comprises alumina ceramics or the like. Substrate 1 has concave holes (cavities) 3. Input/output pins 6 are provided on the upper surface of substrate 1.

Cavities 3 are used for mounting LSI chips 2 which have a plurality of electrode terminals 2T on an upper surface. Specifically, LSI chips 2 are embedded in cavities 3, respectively. In this embodiment, substrate 1 includes four cavities 3, and four LSI chips 2 are inserted in four cavities 3, respectively.

Referring to FIG. 2, the depth of cavity 3 (depth of groove) is formed to be equal, or substantially equal, to the thickness of LSI chip 2. Therefore, the upper surface on which electrode terminals (connection pads) 2T (2a, 2b, and 2c) are provided, is even, or substantially even, with the upper surface of substrate 1. Thus, the upper surface of LSI chips 2 and the upper surface of substrate 1 form an even surface. If some LSI chips 2 are not identical to the others and have various thickness, the corresponding cavity 3 has equal, or substantially equal, depth to LSI chip 2. LSI chip 2 is fixed to cavity 3 by a filler 4. The material of filler 4 includes resin.

A thin-film wiring layer 5 is formed on substrate 1 and LSI chip 2. Thin-film wiring layer 5 is used for providing wiring which interconnects electrode terminals 2T (2a,2b, and 2c). Thin-film wiring layer 5 includes insulating layers 51 to 55 and wiring layers 56 to 59. Insulating layers 51 to 55 include an insulating material such as $SiO_2$ or SiN. Wiring layers 56 to 59 include a conductive material such as a metal, for example, copper.

Insulating layer 51 is formed on the upper surfaces of substrate 1, LSI chips 2 and filler 4. Insulating layer 51 fills up small bumps of the upper surface which are formed by the upper surfaces of substrate 1, LSI chips 2 and filler 4. The upper surface of insulating layer 51 is formed to be even, or substantially even. Insulating layer 51 is thick enough so that tis upper surface becomes even, or substantially even. Vias are formed on insulating layer 51.

Wiring layer 56 is formed on insulating layer 51. Wiring layer 56 has wiring which connects electrode terminals 2a through the vias formed on insulating layer 51. Because wiring layer 56 is formed on the even upper surface of insulating layer 51, stage disconnection rarely occur in wiring layer 56, thus, wiring layer 56 has fine wiring. The wiring width of wiring layer 56 is thinner than the wiring width of wiring layer 57. The wiring density of wiring layer 56 is thicker than the wiring density of wiring layer 57.

Figure 3:
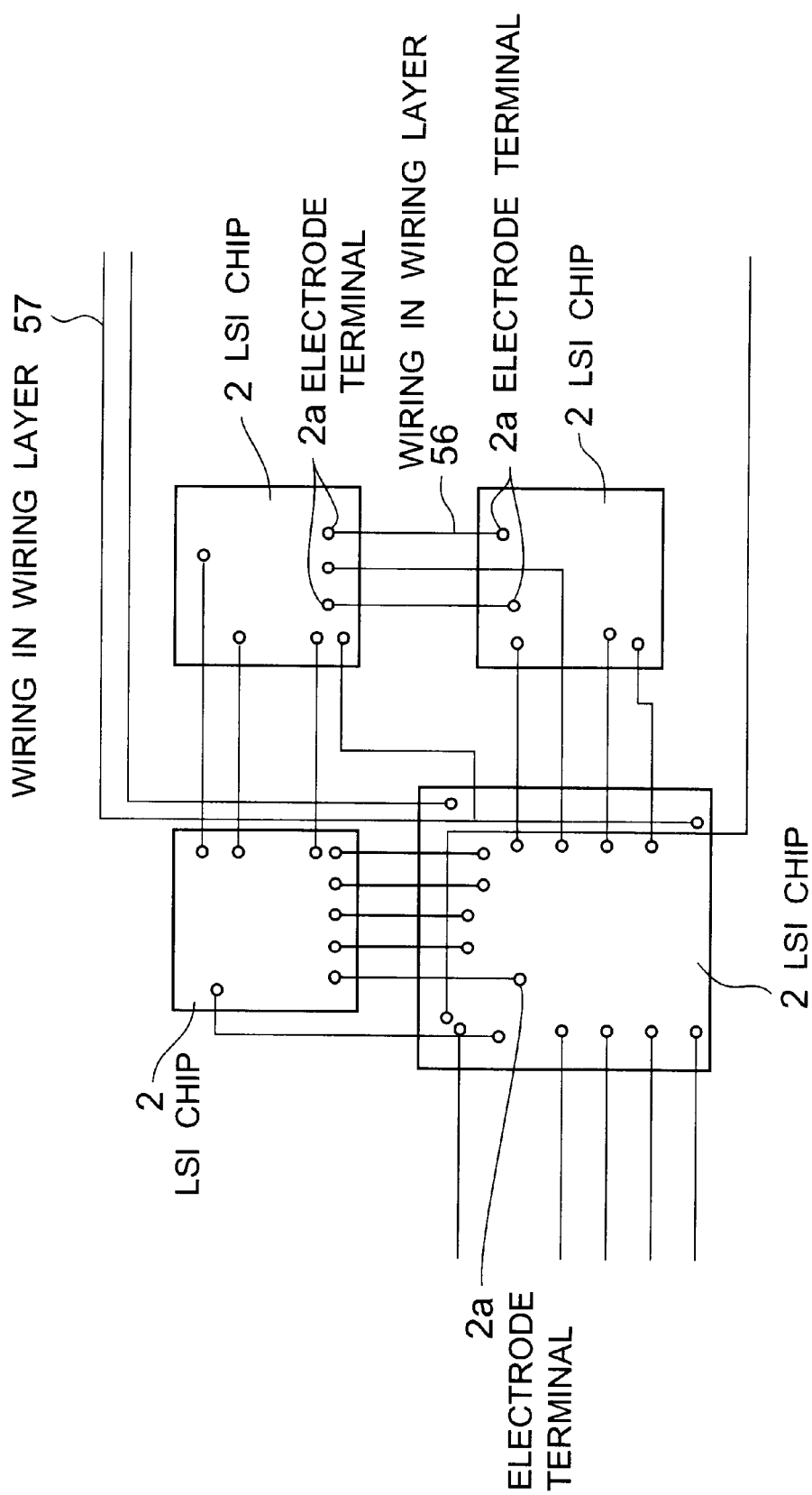
FIG. 3 is a block diagram for explaining a state of the wiring of a multichip module of the present invention.

Referring to FIG. 3, wiring formed in wiring layer 56 is used for connecting terminals relatively close to each other.

For example, wiring in wiring layer 56 connects electrode terminals 2a of contiguous LSI chips 2.

In FIG. 2, insulating layer 52 is formed on wiring layer 56.

Wiring layer 57 is formed on insulating layer 52. As shown in FIG. 3, wiring layer 57 has wiring which connects electrode terminals 2a relatively far apart from each other through the vias formed on insulating layer 51 and insulating layer 52. For example, the wiring in layer 57 connects terminals 2a of separated LSI chips 2 or terminal 2a and an input/output pin 6. The maximum wiring length of the wiring in wiring layer 57 is greater than or equal to that of the wiring length in wiring layer 56.

Insulating layer 53 is formed on wiring layer 57.

Wiring layer 58 is formed on insulating layer 53. Wiring layer 58 has wiring connected to the reference potential. For example, the reverence potential is ground. The wiring of wiring layer 58 is connected to a ground (reference potential) terminal 2b through the vias formed on insulating layers 51, 52, and 53.

Insulating layer 54 is formed on wiring layer 58.

Wiring layer 59 is formed on insulating layer 54. Wiring layer 59 has power-supply wiring to which a power-supply potential VDD is applied.

The wiring of wiring layer 59 is connected to power-supply terminals 2c through vias formed on insulating layers 51 to 54.

Insulating layer 55 is formed on wiring layer 59 and functions as a protective film.

Input/output pins 6 are formed on the edge area of substrate 1. Input/output pins are connected to the wiring of several wiring layers, ground-voltage wiring, and power-supply wiring, which is extended to the edge area of substrate 1 to transfer a signal to and from an external circuit (not illustrated) and to receive the power supply.

As described above, the upper surfaces of substrate 1, LSI chips 2 and filler 4 forms an even, or substantially even surface. This makes the upper surface of insulating layer 51 even, thus stage disconnections seldom occur in wiring layer 56. Therefore, it is possible to form fine wires as much as possible in wiring layer 56. If the wiring of wiring layer 56 is made to be fine, it is possible to decrease the wiring density, thicken the wiring, and prevent the wiring resistance from increasing and the number of wiring layers in wiring layers 57, 58 and 59. In addition, because no impedance discontinuous point such as a bump, exists in the joint between LSI chip 2 and the wiring of substrate 1, electrical characteristics are improved. Moreover, it is unnecessary to use a solder bump for connection and it is possible to make the wiring fine between the electrode terminals 2T.

Next, the method for manufacturing a multichip module will be described below.

First, a substrate 1, on which a plurality of cavities 3 for storing LSI chips are formed, is prepared.

Figure 4A:
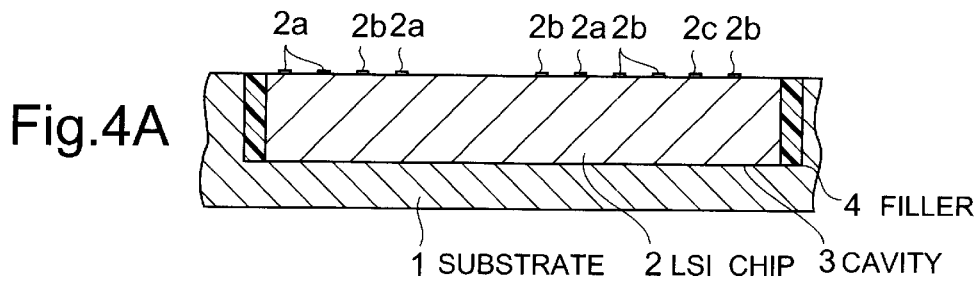
FIGS. 4A to 4D are illustrations showing the manufacturing method of the present invention.

Referring to FIG. 4A, LSI chip 2 is die-bonded in cavity 3. The gap between LSI chip 2 and substrate 1 is filled and sealed with filler 4 made of resin. In this step, it is important to accurately bond LSI chip 2 to cavity 3 by drawing an alignment mark. An alignment accuracy in a range of 3 to 6 micrometer is necessary but it depends on the shape of electrode terminal 2T. It is necessary to accurately perform die-bonding so that the upper surface of substrate 1, the upper surface of injected filler 4 and the upper surface of LSI chip 2, on which electrode terminal 2T is formed, become even, or substantially even.

Figure 4B:
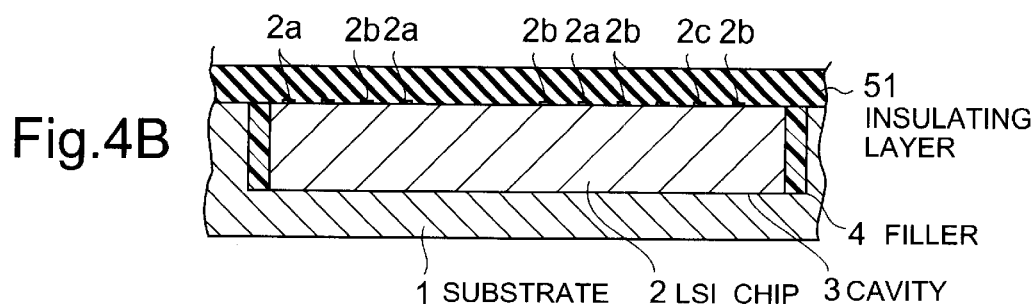

In FIG. 4B, after injecting filler 4, filler 4 is cured, and an insulating material is deposited on the entire upper surface of substrate 1, LSI chips 2 and filler 4 by CVD method. Insulating layer 51 is formed up to the desired thickness which eliminates a little unevenness, any exists, on the upper surface of substrate 1, LSI chips 2 and filler 4. The thickness is also set so that the upper surface of insulating layer 51 becomes even.

Figure 4C:
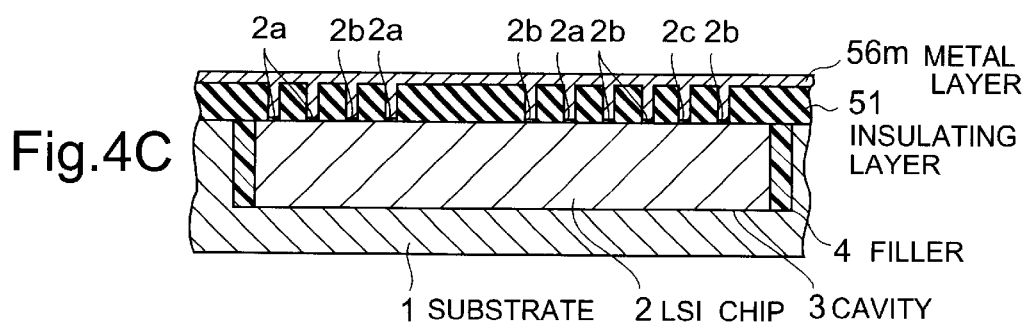

Referring to FIG. 4C, after forming insulating layer 51, a via reaching an electrode terminal 2T (2a, 2b, and 2c) is formed on insulating layer 51 by lithography. A copper seed layer is formed on insulating layer 51 on which the via is formed by, for example, sputtering, and a metal layer (copper layer) 56m is formed by applying electrolytic plating to the entire surface.

Figure 4D:
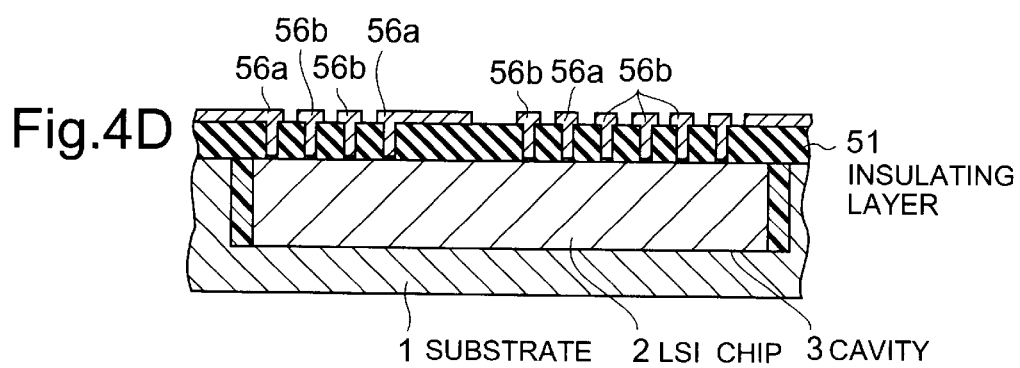

In FIG. 4D, metal layer 56m is patterned by photolithography to form wiring 56a which connects terminals 2a to each other through a part of a via. A wiring electrode (leading electrode) 56b is also formed. Wiring electrode 56b is embedded in the other part of the via. Because the upper surface of the lower layer, namely, insulating layer 51, is even, or substantially even, it is possible to sufficiently narrow the wiring 56a depending on the desired wiring resistance. For example, when the thickness of a metal layer 56m is approximately 5 micrometers, the maximum wiring length is approximately 15 millimeters and the wiring resistance is set to no more than 10 ohms, the wiring is formed so that the width of the wiring becomes approximately 5 micrometers.

Next, an insulating material is deposited on wiring 56a and wiring electrode 56b by a CVD method. Insulating layer 52 is formed. A via reaching wiring electrode 56b or wiring 56a is formed on insulating layer 52 by lithography.

Figure 5A:
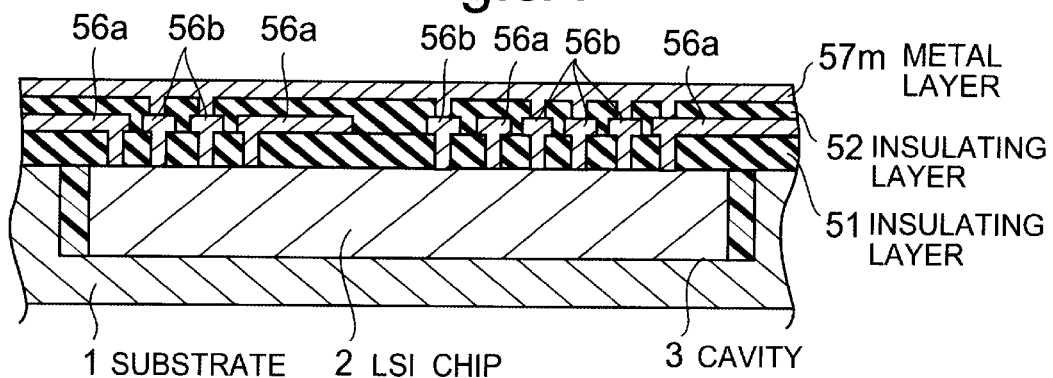
FIGS. 5A to 5C are illustrations showing the manufacturing method of the present invention.

In FIG. 5A, a metal layer 57m is formed on insulating layer 52 by sputtering and electrolytic plating the same way as metal layer 56m is formed.

Figure 5B:
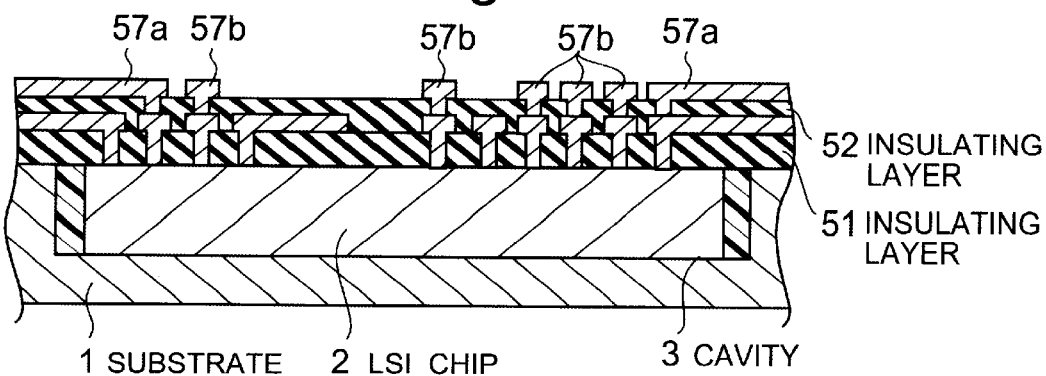

Referring to FIG. 5B, metal layer 57m is formed in a desired pattern by lithography to form a wiring electrode 57b, which is connected to a power-supply terminal 2c and a ground terminal 2b through wiring electrode 56b, and a wiring 57a, which has a relatively long wiring length for connecting terminals 2a each other. Some terminals of electrode terminal 2T and wiring 57a are extended up to the edge area of substrate 1, where input/output pins 6 are arranged.

When the wiring having a length of 15 millimeters or less is formed in wiring layer 56, the amount of wiring necessary for wiring layer 57 becomes relatively small. Therefore, it is possible to sufficiently increase the width of the wiring in wiring layer 57. Otherwise, a large wiring resistance is produced because of the large wiring length. For example, when the thickness of a metal layer 57m is approximately 5 micrometers, the maximum wiring length is approximately 50 millimeters and the wiring resistance is set to no more than 10 ohms, the wiring is formed so that the width of the wiring becomes 15 to 20 micrometers.

Figure 5C:
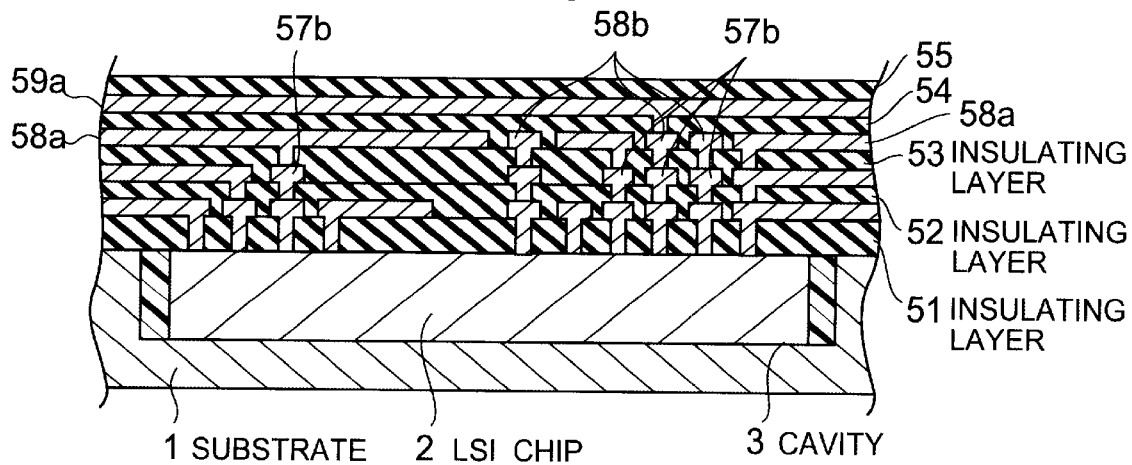

In FIG. 5C, by using the same method as described above, an insulating layer 53 is formed on wiring 57a and wiring electrode 57b. Insulating layer 53 is formed in a desired pattern and a via reaching the wiring electrode 57b is formed. Moreover, a metal layer 58m is formed on insulating layer 53. Metal layer 58m is shaped into a ground-potential wiring 58a connected to ground terminal 2b and a wiring electrode 58b connected to wiring electrode 57b. Ground-voltage wiring 58a is extended up to the region where input/output pins 6 for ground are arranged.

By using the same method as described above, an insulating layer 54 is formed on ground-voltage wiring 58a and a metal layer 59m is formed on insulating layer 54. Metal layer 59m is shaped into wiring layer 59, which includes a power-supply wiring 59a connected to power-supply terminal 2c. Power-supply wiring 59a is extended up to the region where input/output pins 6 for a power supply are arranged.

Finally, the insulating film of the region identified to form input/output pins 6 is etched and removed, and input/output pins 6 are connected and fixed to the region. Thus, the multichip module as shown in FIG. 1 is manufactured.

According to the above method, the upper surface of substrate 1 becomes even, or substantially even, with the surface of LSI chip 2, on which the circuit is formed. Therefore, the upper surface of insulating layer 51 becomes even, or substantially even. Thus, exposure and development losses are not produced, and fine wiring is attained.

In addition, because fine wiring is formed in wiring layer 56, it is possible to increase the wiring density of wiring layer 56. On the other hand, the wiring density of wiring layer 57 can be decreased, thereby the wiring width of wiring layer 57 is increased, the wiring resistance is decreased, and a signal can be transferred over a long distance without attenuation.

Furthermore, in this example there are four wiring layers, therefore it is possible to form the second wiring 57a, ground-voltage wiring 58a, and power-supply-voltage wiring 59a in the same layer.

Instead of connecting electrode terminals 2T of a circuit of LSI chips 2 and wiring layers 56 to 59 by a bump, which causes impedance to become unequal, electrode terminals 2T and the circuit on LSI chips 2 are directly connected to each other by the wiring therefore, impedance becomes equal. Therefore, it is possible to improve electrical characteristics. In addition, because solder bumps are not used to make connections it is possible to use fine wiring.

In the above embodiment, four wiring layers are formed, however, it is also possible to form five or more wiring layers. For example, when five wiring layers are formed, the wiring whose length is in the shortest range is formed as a pattern in the lowest metal layer, the wiring whose length is in a middle range is formed as a pattern in the intermediate metal layer, and the wiring whose length is in the longest range is wiring are formed as patterns over these metal layers. In this case, because wire width can be set at three levels based on the length of the wiring of each layer, it is possible to further increase the wiring density.

In the embodiment, substrate 1 is made of alumina ceramics, however, it is possible to make substrate 1 using a printed-circuit board material such as FR4 or BT resin as long as the material has a thickness which can suppress substrate warping. When it is preferable to use a material having a low thermal resistance, it is possible to use aluminum nitride (AIN) which can function to cooling LSI chip 2.

While LSI chip 2 is wired with copper wiring in the embodiment, it is possible to wire LSI chip 2 with any other metal.

The wiring in wiring layers 56 and 57 is not limited to the above embodiments. It is possible to provide any wiring as long as the length and the resistance of the wiring kept in acceptable ranges.

In the embodiment, power-supply wiring 59a is formed in a layer above the layer of ground-voltage wiring 58a. However, it is possible to form power-supply-voltage wiring 59a in a layer lower than the layer of the ground-voltage wiring.

The layer thickness, the maximum wiring length, and the wiring width of wiring layers 56 and 57 are not limited to the ones described in the embodiments. It is possible to arbitrarily change them based on the necessary resistance of wiring.

While four LSI chips 2 are mounted on a multichip module in the embodiment, the number of LSI chips 2 to be mounted on a multichip module of the present invention is not limited to four. For example, it is possible to mount five ore more LSI chips or three or less LSI chips on a multichip module.

In the embodiment, a signal is transferred between an external circuit and LSI chip 2 through input/output pins 6. However, the transfer of a signal is not limited to use of input/output pins 6. It is possible to use a solder ball or a land.

While this invention has been described in conjunction with the preferred embodiments described above, it will now be possible for those skilled in the art to put this invention into practice in various other manners.

What is claimed is:

1. A method for manufacturing a multichip module, which includes a substrate having a plurality of cavities provided thereon, and a plurality of chips, comprising:

providing a plurality of chips in said plurality of cavities, so that an upper surface of said chips and an upper surface of said substrate become even, or substantially even;

forming a first insulating layer on said upper surface of said chips and said upper surface of said substrate;

forming a first wiring layer on said first insulating layer;

forming a second insulating layer on said first wiring layer; and forming a second wiring layer on said second insulating layer;

wherein said first wiring layer is formed so that the wiring density thereof is greater than the wiring density of said second wiring layer during said first wiring layer forming step.

2. The method as claimed in claim 1, wherein said first insulating layer is formed so that the upper surface thereof is even, or substantially even, during said first insulating layer forming step.

* * * * *